United States Patent [19]
Lee

[11] Patent Number: 5,641,709
[45] Date of Patent: Jun. 24, 1997

[54] METHOD OF MANUFACTURING A CONDUCTIVE MICRO BRIDGE

[75] Inventor: Don-Hee Lee, Kyungki-do, Rep. of Korea

[73] Assignee: LG Semicon Co., Ltd., Chungcheongbuk-do, Rep. of Korea

[21] Appl. No.: 520,806

[22] Filed: Aug. 30, 1995

[30] Foreign Application Priority Data

Aug. 30, 1994 [KR] Rep. of Korea ............... 21586/1994

[51] Int. Cl.⁶ .................... H01L 21/44; H01L 21/465
[52] U.S. Cl. ........................... 438/3; 438/619
[58] Field of Search ................... 437/189, 228, 437/235, 236, 245, 901, 927, 60

[56] References Cited

U.S. PATENT DOCUMENTS

| | | | |
|---|---|---|---|
| 4,948,757 | 8/1990 | Jain et al. | 437/240 |
| 5,013,693 | 5/1991 | Guckel et al. | 437/901 |
| 5,059,556 | 10/1991 | Wilcoxen | 437/927 |
| 5,164,339 | 11/1992 | Gimpelson | 437/235 |
| 5,270,574 | 12/1993 | Boysel | 437/927 |
| 5,489,556 | 2/1996 | Li et al. | 437/927 |
| 5,508,231 | 4/1996 | Ball et al. | 437/927 |

*Primary Examiner*—Tuan H. Nguyen
*Attorney, Agent, or Firm*—Morgan, Lewis and Bockius LLP

[57] ABSTRACT

A method of manufacturing a conductive micro bridge includes the steps of preparing a semiconductor substrate, forming an insulating film on the semiconductor substrate, forming a sacrificial layer on the insulating film, forming a metal-oxide composite film on the sacrificial layer so as to surround the sacrificial layer, and removing the sacrificial layer to thereby form an air gap in the removed portion.

23 Claims, 5 Drawing Sheets

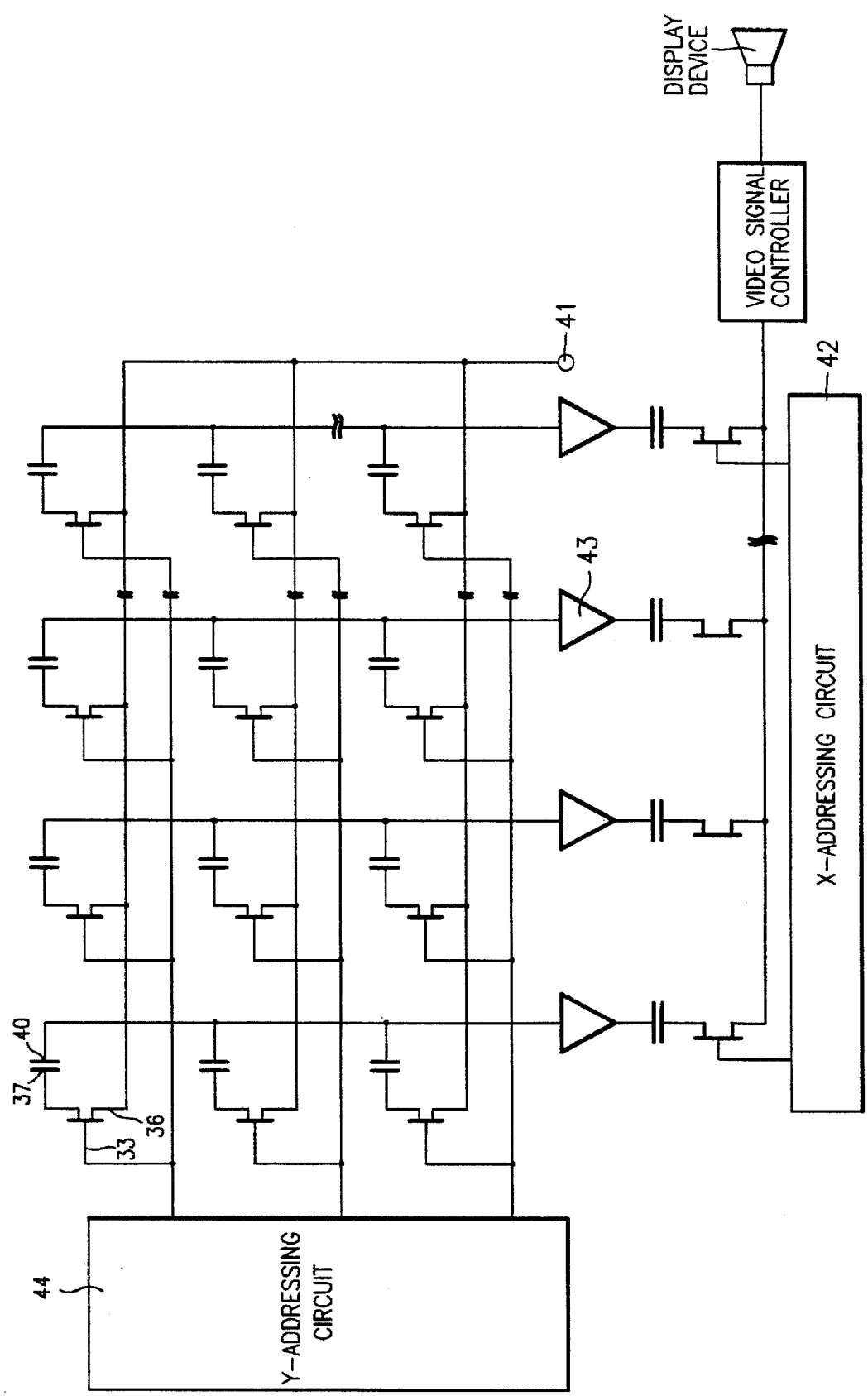

METHOD OF MANUFACTURING A CONDUCTIVE MICRO BRIDGE

BACKGROUND OF THE INVENTION

1. Field of the Invention

The present invention relates to a micro bridge, and more particularly, to a method of manufacturing a conductive micro bridge including a metal-oxide composite.

2. Discussion of the Related Art

In general, methods of manufacturing a micro bridge are largely divided into two groups. One group employs a bulk micromachining technique using anisotropic etching characteristics of silicon. The other group employs a surface micromachining technique using a sacrificial layer.

The micromachining technique uses a semiconductor substrate, and particularly, is applied to a semiconductor substrate on which a matrix of switching field effect transistors are formed. Thus, using this technique, an integrated device can be manufactured.

As an example, a micro bridge is directly formed on a silicon switching matrix using the surface micromachining technique, and a ferroelectric thin film is formed thereon, thereby manufacturing a highly sensitive integrated infrared rays imager.

In a conventional micro bridge formed according to the surface micromachining technique, a sacrificial layer is formed of a phosphosilicate glass (PSG) film. The micro bridge formed thereon is manufactured mainly using a heavily doped polycrystalline silicon.

Thermal conductivity characteristics of thermal flow perpendicular to the surface of the device manufactured by the above technique can be expressed by the following equation:

$$H = kA\ (\partial T/\partial n) \qquad (1)$$

Here, H is heat, k is a conductivity, A is an area of conduction, and ($\partial T/\partial n$) is a thermal gradient in the surface. The above equation can be simplified, as follows:

$$H = K\Delta T \qquad (2)$$

Here, K is a thermal conductivity of a sensing material, and $\Delta T$ is a temperature difference, where $$K = kA/L \qquad (3)$$

Here, L is a length of the thermal conduction portion.

According to the above equations, in order to minimize the thermal loss due to conduction, first, the thermal capacity of the micro bridge must be small. Second, the ratio of A/L must be small, or the path of the thermal conduction must be cut off according to every possible method.

Manufacture of a conventional micro bridge according to the aforementioned surface micromachining technique will be described in connection with FIGS. 1a to 1d.

As shown in FIG. 1a, an insulating film 2 consisting of $SiO_2$ or $Si_3N_4/SiO_2$ is formed on a semiconductor substrate 1. Then, a PSG film 3a is formed on insulating film 2 through a low pressure chemical vapor deposition (LPCVD) method.

As shown in FIG. 1b, a predetermined portion of PSG film 3a is patterned and etched, thereby forming a sacrificial layer 3. As shown in FIG. 1c, using an LPCVD method, a heavily doped polycrystalline silicon film 4 is formed to a thickness of 1 μm so as to surround sacrificial layer 3. The heavily doped polycrystalline silicon film is used as an electrode or wiring material because of its excellent electric conductivity.

As shown in FIG. 1d, PSG film 3 is removed using fluoric acid, thereby forming an air gap 5 in the removed portion. As a result, the micro bridge consisting of the polycrystalline silicon membrane is formed. The micro bridge is then heat-treated at a temperature of about 1000° C. in order to relieve the interior stress created during the preceding steps, thereby completing the manufacturing process.

The conventional micro bridge formed according to the aforementioned process sequence has numerous deficiencies. For example, the aforementioned conventional micro bridge is formed of a polycrystalline silicon film. When a thin film (e.g., a device such as a thin film infrared rays imager) is manufactured using the polycrystalline silicon film, the crystal growth temperature of a ferroelectric thin film formed on the micro bridge becomes high (about 600° C. and more). Accordingly, when a Pb-group ferroelectric film is used, the Pb component of the ferroelectric film and the Si component of the micro bridge are interdiffused perovskite, or chemically reacted. Thus, the physical characteristics, e.g., the generation of a single perivskite crystal is difficult, thereby deteriorating the dielectric characteristics of the thin film.

Secondly, the manufacturing temperature of the micro bridge and the temperature of the heat treatment for removing the interior stress are high (about 1000° C.). The high temperature deteriorates the FETs of the silicon switching matrix.

SUMMARY OF THE INVENTION

The present invention has been made in view of the above circumstances and has as an object to provide a method of manufacturing a chemically stable conductive micro bridge using a metal-oxide composite having improved mechanical strength and conductivity characteristics.

A further object of the present invention is to provide a method of manufacturing a conductive micro bridge in which the interdiffused perovskite or the chemical reaction between the component materials of each layer is suppressed, thereby forming a ferroelectric thin film having excellent crystallization.

A further object of the present invention is to provide a conductive micro bridge in which the micro bridge is formed at room temperature, thereby preventing the deterioration of a silicon switching matrix.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To accomplish the above objects, and in accordance with the purpose of the present invention, as embodied and broadly described herein, the method of manufacturing a conductive micro bridge of this invention includes the steps of preparing a semiconductor substrate, forming an insulating film on the semiconductor substrate, forming a sacrificial layer on a predetermined portion of the insulating film, forming a metal-oxide composite film on the sacrificial layer so as to surround the sacrificial layer, and removing the sacrificial layer to thereby form an air gap in the removed portion.

BRIEF DESCRIPTION OF THE DRAWINGS

The accompanying drawings, which are incorporated in and constitute a part of this specification illustrate embodiment(s) of the invention and, together with the description, serve to explain the objects, advantages, and principles of the invention.

In the drawings,

FIG. 5 is a circuit diagram of the infrared rays sensor of FIG. 4.

DETAILED DESCRIPTION OF THE PREFERRED EMBODIMENTS

Reference will now be made in detail to the present preferred embodiments of the invention, examples of which are illustrated in the accompanying drawings.

Hereinafter, a method of manufacturing a conductive micro bridge according to the present invention will be described with reference to the attached drawings.

FIGS. 2a to 2d are cross-sectional views illustrating a method of manufacturing a conductive micro bridge according to a first embodiment of the present invention.

Figure 1A:
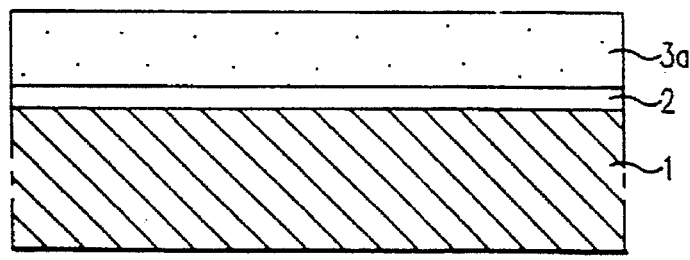
FIGS. 1a through 1d are cross-sectional views illustrating a process for manufacturing a micro bridge according to the conventional surface micro-machining technique.
Figure 1B:
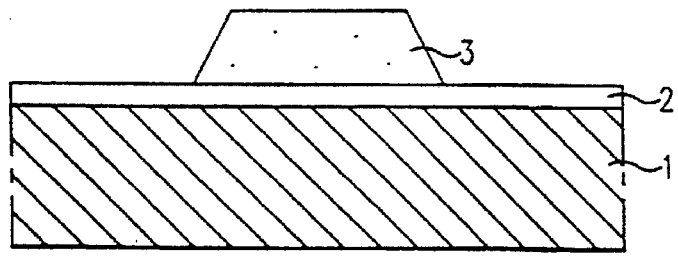
Figure 1C:
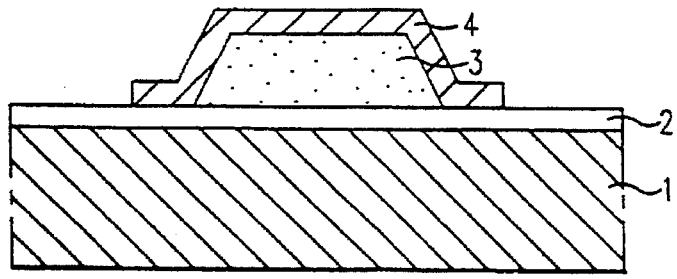
Figure 1D:
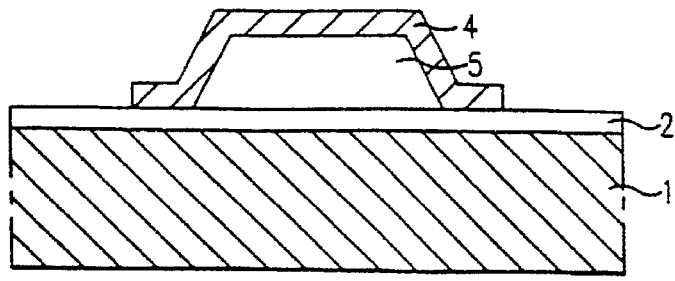
Figure 2A:
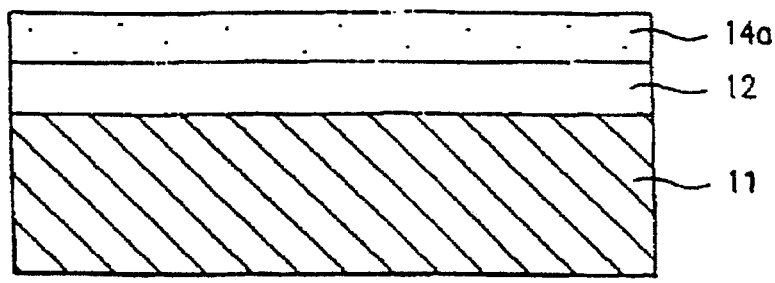
FIGS. 2a through 2d are cross-sectional views illustrating a method of manufacturing a conductive micro bridge according to a first embodiment of the present invention.
Figure 2B:
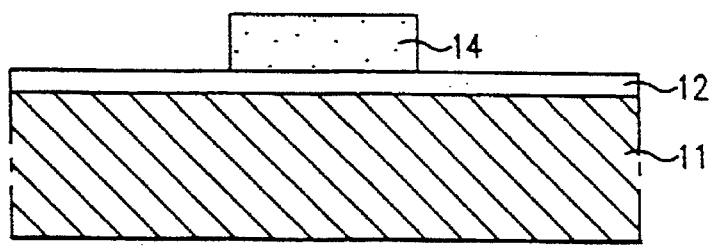

As shown in FIG. 2a, an insulating film 12 is formed on a semiconductor substrate 1. The insulating film 12 may be for example, $SiO_2$ or $Si_3N_4/SiO_2$. A PSG film 14a is then formed on the oxide film 12 and patterned through a photolithographic process, thereby forming a sacrificial layer 14, as shown in FIG. 2b.

Figure 2C:
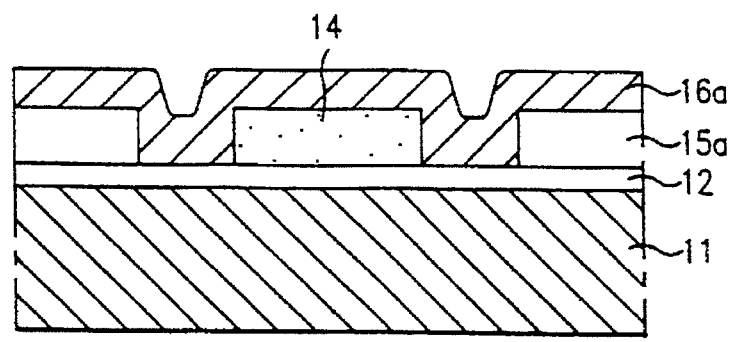

A photoresist film 15a is then formed on the entire surface of the substrate. The photoresist film 15a is patterned, for example, using a photolographic process, to produce a window exposing sacrificial layer 14 and a portion of oxide film 12 on both sides of sacrificial layer 14 as illustrated in FIG. 2c. In one preferred embodiment, sacrificial layer 14 is centered by the photoresist film 15a such that the photoresist film 15a is an equal distance from both sides of sacrificial layer 14.

A metal-oxide composite film 16a is then deposited to a thickness of about 1~3 μm on the entire surface of the substrate. The metal-oxide composite film 16a may be deposited, for example, through a co-sputtering method using a magnetron sputter. Of course, other methods may be used to form the metal-oxide composite film 16a. $Pt$—$TiO_2$ or a $PtTaO_2$ may be used as a material forming metal-oxide composite film 16a. In such a case, the $Pt$—$TiO_2$ or $PtTaO_2$ layer forming the metal-oxide composite film 16a may be simultaneously deposited by controlling the respective deposition speed, for example, by adjusting the power applied to the Pt/Ti target or Pt/Ta target.

Figure 2D:
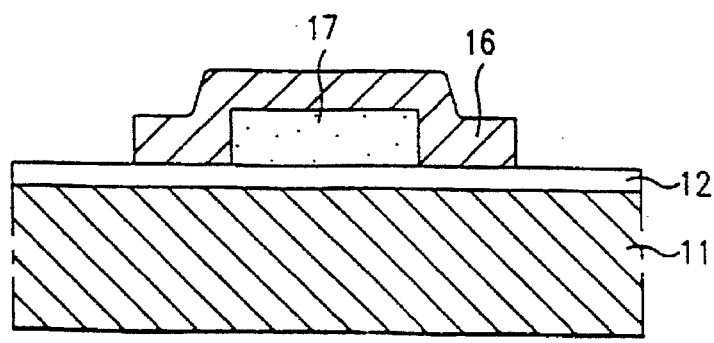

Since the platinum (Pt) and the oxide ($TiO_2$, $TaO_2$) mutually form the composite film, metal-oxide composite film 16a is electrically conductive through the Pt material and has a mechanical strength through the composite of the metal and oxide. As shown in FIG. 2d, metal-oxide composite film 16a and photoresist film 15a are selectively removed through a lift-off process, for example, whereby metal-oxide composite film 16a is formed so as to surround sacrificial layer 14. Then, sacrificial layer 14 is laterally etched using fluoric acid thereby forming an air gap 17 in the etched portion. As a result, the conductive micro bridge is completed.

FIGS. 3a to 3e are cross-sectional views illustrating a method of manufacturing a conductive micro bridge according to a second embodiment of the present invention. Here, a polyimide film is used as the sacrificial layer, thereby manufacturing the micro bridge.

Figure 3A:
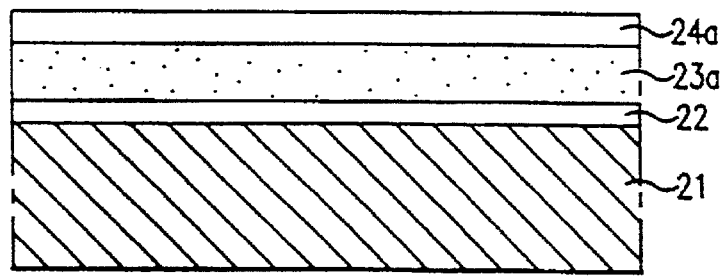
FIGS. 3a through 3e are cross-sectional views illustrating a method of manufacturing a conductive micro bridge according to a second embodiment of the present invention.

As shown in FIG. 3a, an insulating film 22 is formed on a semiconductor substrate 21. The insulating film 22 may be formed of $SiO_2$ or $Si_3N_4/SiO_2$, for example. A polyimide film 23a is formed on insulating film 22.

Figure 3B:
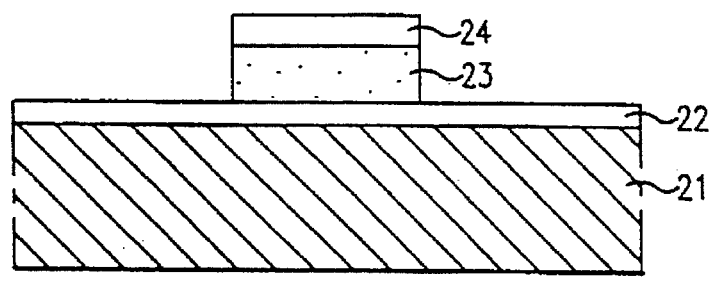

After baking polyimide film 23a twice, for example, a first photoresist film 24a is formed thereon. A predetermined portion of first photoresist film 24a is patterned using a photolithographic process, for example. The first photoresist film 24a and polyimide film 23a are etched, as illustrated in FIG. 3b. A developer may be used when etching first photoresist film 24a and polyimide film 23a.

Figure 3C:
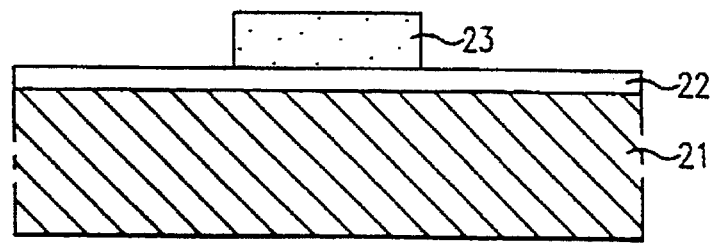

As shown in FIG. 3c, the remaining first photoresist film 24 is removed, thereby forming a sacrificial layer 23 of polyimide film 23a. First photoresist film 24 is removed using an etching solution selective to polyimide film 23a and first photoresist film 24, e.g., n-BCA is used to removed first photoresist film 24.

Figure 3D:
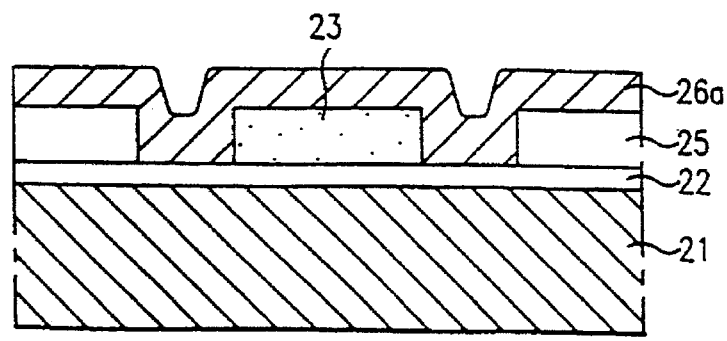

As shown in FIG. 3d, a second photoresist film 25 is formed on the entire surface of the substrate and patterned, using a photolithographic process, for example, so as to have an equal distance from both sides of sacrificial layer 23. A material of $Pt$—$TiO_2$ or $PtTaO_2$ is then deposited, for example, by the same method as that of the first embodiment (co-sputtering) to form a metal-oxide composite film 26a. Metal-oxide composite film 26a is formed so as to surround sacrificial layer 23.

Figure 3E:
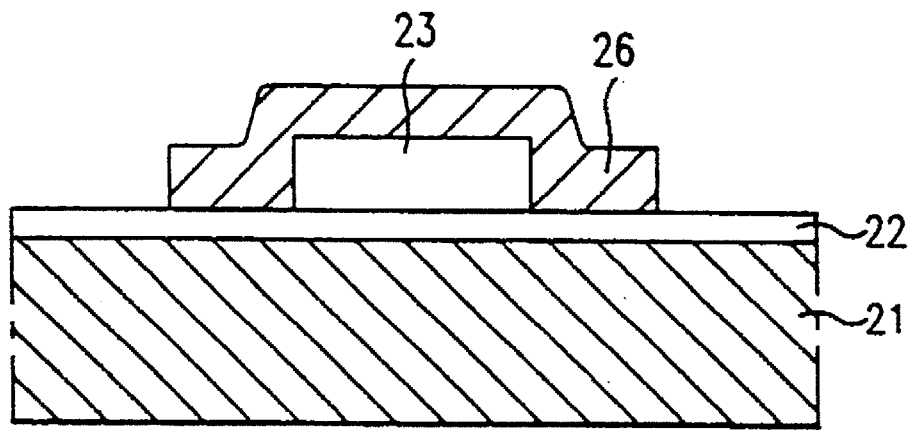

As shown in FIG. 3e, metal-oxide composite film 26a and second photoresist film 25 are selectively removed through a lift-off process. Then, sacrificial layer 23 is removed by the same method as that of the first embodiment (lateral etching using Fluoric acid), thereby forming an air gap in the removed portion. As a result, the conductive micro bridge is manufactured.

Figure 4:
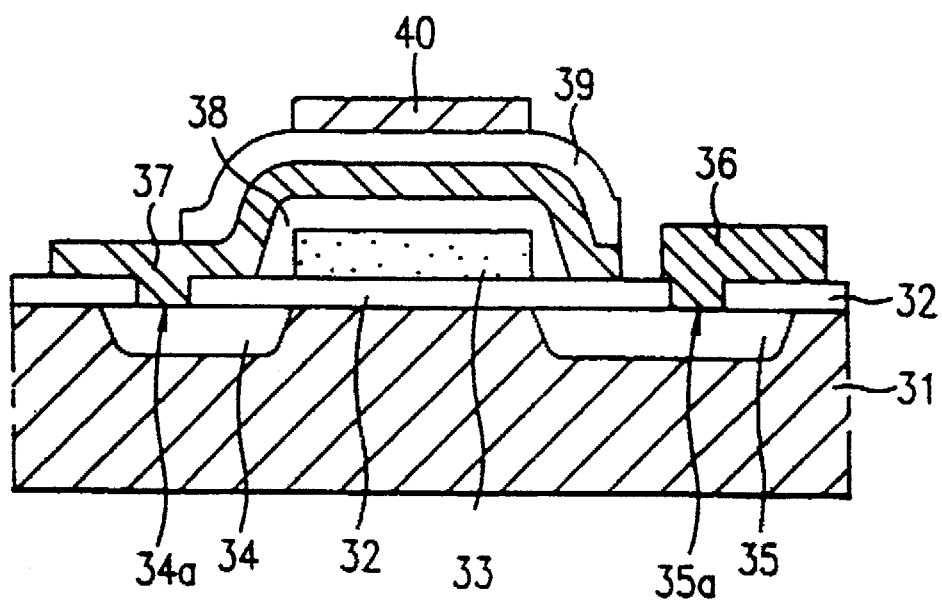
FIG. 4 is a cross-sectional view showing the structure of an infrared rays sensor to which the conductive micro bridge of the present invention is applied.

FIG. 4 and FIG. 5 show an example of the conductive micro bridge manufactured according to the present invention and used in a device. FIG. 4 is a cross-sectional view of a thin film infrared rays imager using the conductive micro bridge of the present invention as a lower electrode. FIG. 5 is a circuit diagram of the thin film infrared rays imager of FIG.4.

In the manufacturing method of the thin film infrared rays imager device using the conductive micro bridge of the present invention, as shown in FIG.4, a gate insulating film 32 is formed on a matrix-like semiconductor substrate 31. A gate electrode 33 is formed on gate insulating film 32. The gate electrode 33 may be formed of polysilicon or gold (Au), for example. Using gate electrode 33 as a mask, impurity regions 34 and 35, serving as source/drain electrodes, are formed on semiconductor substrate 31 thereby forming a switching FET. After forming a contact hole 35a on impurity region 35 for the drain electrode, a drain pad 36 is formed thereon.

In order to form an air gap on gate electrode 33, a PSG film or a polyimide film (not shown) is deposited so as to surround gate electrode 33 by the same method as that of the first or second embodiment of the present invention. The PSG or polyimide film serves as a sacrificial layer.

According to the same method as that of the first or second embodiment of the present invention, a metal-oxide composite film including a Pt—$TiO_2$ or $PtTaO_2$ layer is formed thereon, thereby forming a conductive micro bridge, i.e., a lower electrode 37. Lower electrode 37 is connected with impurity region 34 of the FET switch through contact hole 34a formed by etching the predetermined portion of gate insulating film 32 on impurity region 34 for the source electrode. The sacrificial layer (not shown) is removed by the same method as that of the first or second embodiment of the present invention, thereby forming an air gap 38.

A ferroelectric thin film 39 is formed to a thickness of about 1~4 μm on lower electrode 37, according to a method such as sol-gel, chemical vapor deposition (CVD), or sputtering. $Pb(Zr, Ti)O_3$, $Pb(Sc, Ta)O_3$, $(Ba, Sr)TiO_3$ and the like are used as a ferroelectric film 39. An upper electrode 40 is formed on ferroelectric film 39 using Ni—Cr or gold-back for absorption of infrared rays, thereby completing the imager device.

In the imager device manufactured as described above, as shown in FIG. 5, drain pad 36 of each FET switch is connected to a bias source 41, for example, using wire bonding. Upper electrode 40 is connected to a preamplifier 43 connected to an X-addressing circuit 42. Gate electrode 33 of the FET switch is connected to a Y-addressing circuit 44, thereby completing the circuit of the imager device.

When the conductive micro bridge of the present invention is applied to a thin film infrared rays imager device manufactured by the aforementioned method, air gap 38 is formed below ferroelectric thin film 39, which senses the infrared rays. Thus, air gap 38 serves as a heat sink blocking thermal transmission from ferroelectric thin film 39 to the elements below. Further, since ferroelectric thin film 39 is formed of a thin film, the thermal capacity thereof is minimized.

The conductive micro bridge according to the present invention as described above is comprised of the metal-oxide composite film. Accordingly, it is mechanically and chemically stable. Particularly, in case of depositing a thin film, such as the ferroelectric film, on the conductive micro bridge, the interdiffused perovskite or the chemical reaction between the component materials is suppressed, thereby forming the ferroelectric thin film having excellent crystallization on the conductive micro bridge.

Further, since the micro bridge is formed at a low temperature, when an integrated device using a semiconductor substrate is manufactured (e.g., a device such as the thin film infrared rays imager using the silicon switching matrix), the deterioration of the switching matrix due to the heat is prevented. In addition, the manufacturing process can be simplified.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of manufacturing a conductive micro bridge, comprising the steps of:

preparing a semiconductor substrate;

forming a sacrificial layer on said semiconductor substrate;

forming a metal-oxide composite on said sacrificial layer; and removing said sacrificial layer to form an air gap in the removed portion.

2. A method of manufacturing a conductive micro bridge as claimed in claim 1, wherein said sacrificial layer includes a phosphosilicate glass film.

3. A method of manufacturing a conductive micro bridge as claimed in claim 1, wherein said sacrificial layer includes a polyimide film.

4. A method of manufacturing a conductive micro bridge as claimed in claim 1, wherein said step of forming a sacrificial layer comprises the steps of:

forming an insulating film on said semiconductor substrate;

forming a phosphosilicate glass film on said insulating film; and patterning the phosphosilicate glass film.

5. A method of manufacturing a conductive micro bridge as claimed in claim 4, wherein the patterning step includes a photolithographic process.

6. A method of manufacturing a conductive micro bridge as claimed in claim 1, wherein said step of forming a sacrificial layer comprises the steps of:

forming an insulating film on said semiconductor substrate;

forming a polyimide film on said insulating film;

performing a heat-treatment of said polyimide film;

forming a first photoresist film on said polyimide film;

patterning said first photoresist film corresponding to a desired pattern of the sacrificial layer;

removing said first photoresist film and the portion of said polyimide film; and removing the remaining portion of said first photoresist film to form said sacrificial layer.

7. A method of manufacturing a conductive micro bridge as claimed in claim 6, wherein said polyimide film undergoes a second heat treatment.

8. A method of manufacturing a conductive micro bridge as claimed in claim 1, wherein said metal-oxide composite film is formed to surround said sacrificial layer.

9. A method of manufacturing a conductive micro bridge as claimed in claim 1, wherein said step of forming a metal-oxide composite film comprises the steps of:

forming a second photoresist pattern on said semiconductor substrate;

forming a metal-oxide composite film on an entire surface of said substrate; and simultaneously removing said second photoresist film and the portion of said metal-oxide composite film.

10. A method of manufacturing a conductive micro bridge as claimed in claim 9, wherein the second photoresist pattern is formed to have an equal distance form both sides of the sacrificial layer.

11. A method of manufacturing a conductive micro bridge as claimed in claim 9, wherein the simultaneously removing step uses a lift-off method.

12. A method of manufacturing a conductive micro bridge as claimed in claim 1, wherein said insulating film includes a $Si_3N_4/SiO_2$ layer.

13. A method of manufacturing a conductive micro bridge as claimed in claim 1, wherein said metal-oxide composite film includes a Pt—$TiO_2$ layer.

14. A method of manufacturing a conductive micro bridge as claimed in claim 13, wherein said Pt—TiO$_2$ layer is formed by co-sputtering the Pt and Ti.

15. A method of manufacturing a conductive micro bridge as claimed in claim 1, wherein said metal-oxide composite film includes a PtTaO$_2$ layer.

16. A method of manufacturing a conductive micro bridge as claimed in claim 15, wherein said PtTaO$_2$ layer is formed by co-sputtering the Pt and Ta.

17. A method of manufacturing a conductive micro bridge as claimed in claim 1, wherein said metal-oxide composite film is formed to a thickness of about 1~3 μm.

18. A method of manufacturing a conductive micro bridge as claimed in claim 1, further comprising the step of forming a ferroelectric film on said metal-oxide composite film.

19. A method of manufacturing a conductive micro bridge as claimed in claim 1, wherein said step of forming a sacrificial layer comprises the steps of:

forming an insulating film on said semiconductor substrate;

forming a polyimide film on said insulating film;

performing a heat-treatment of said polyimide film;

forming a photoresist film on said polyimide film;

patterning said photoresist film to distinguish a sacrificial layer region from adjacent regions;

removing portions of said photoresist film and said polyimide film from the adjacent regions; and removing the remaining photoresist film from the sacrificial layer region, the remaining polyimide film forming said sacrificial layer.

20. A method of manufacturing a conductive micro bridge as claimed in claim 1, wherein said step of forming a metal-oxide composite film comprises the steps of:

forming a second photoresist film over said semiconductor substrate, said second photoresist film having a window centered about said sacrificial layer such that edges of said second photoresist film are an equal distance from said sacrificial layer;

forming a metal-oxide composite film on the entire surface of said semiconductor substrate; and simultaneously removing said second photoresist film and the portion of said metal-oxide composite film underlying said second photoresist film using a lift-off method.

21. A method of manufacturing a conductive micro bridge, the method comprising the steps of:

preparing a substrate;

forming an insulating layer on said substrate;

forming a phosphosilicate glass film on said insulating layer;

patterning the phosphosilicate glass film to form a sacrificial layer;

forming a photoresist film over said substrate, said photoresist film having a window portion exposing said sacrificial layer and a portion of said insulating film surrounding said sacrificial layer;

forming a metal-oxide composite film on said photoresist film, said sacrificial layer, and said portion of said insulating film surrounding said sacrificial layer, said sacrificial layer being covered by said metal-oxide composite film;

selectively removing said photoresist film and portions of said metal-oxide composite film overlying said photoresist film; and removing the sacrificial layer to form an air gap beneath the remaining metal-oxide composite film.

22. A method of manufacturing a conductive micro bridges, the method comprising the steps of:

preparing a substrate;

forming an insulating layer on said substrate;

forming a polyimide film on said insulating layer;

heat-treating said polyimide film;

forming a first photoresist film on said polyimide film;

patterning said first photoresist film to distinguish a sacrificial layer region from adjacent regions;

etching portions of said first photoresist film and said polyimide film from the adjacent regions; and etching the remaining first photoresist film from the sacrificial layer region, the remaining polyimide film forming a sacrificial layer;

forming a second photoresist film over said substrate, said second photoresist film having a window exposing said sacrificial layer and a portion of said insulating film surrounding said sacrificial layer;

forming a metal-oxide composite film on said second photoresist film, said sacrificial layer, and said portion of said insulating film surrounding said sacrificial layer, said sacrificial layer being covered by said metal-oxide composite film;

selectively removing said second photoresist film and portions of said metal-oxide composite film overlying said second photoresist film; and removing said sacrificial layer to form an air gap beneath the remaining metal-oxide composite film.

23. A method of manufacturing a semiconductor device, comprising the steps of:

forming a gate electrode over a surface of a semiconductor substrate;

forming a first impurity region in a first surface region of the semiconductor substrate adjacent said gate electrode and a second impurity region in a second surface of the semiconductor substrate adjacent said gate electrode and opposite said first impurity region;

forming a sacrificial layer to surround said gate electrode;

forming a metal-oxide composite film on said sacrificial layer and coupled to one of said first and second impurity regions;

removing said sacrificial layer to thereby form an air gap between the metal-oxide composite film and said gate electrode; and forming a ferroelectric film on said metal-oxide composite film.

* * * * *